(12) United States Patent
Ahn et al.

(10) Patent No.: US 6,930,346 B2
(45) Date of Patent: Aug. 16, 2005

(54) EVAPORATION OF Y-SI-O FILMS FOR MEDIUM-K DIELECTRICS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/930,138

(22) Filed: Aug. 31, 2004

(65) Prior Publication Data

US 2005/0026374 A1 Feb. 3, 2005

Related U.S. Application Data

(62) Division of application No. 10/099,194, filed on Mar. 13, 2002, now Pat. No. 6,812,100.

(51) Int. Cl.$^7$ .................. H01L 27/108; H01L 29/76; H01L 29/94; H01L 31/119
(52) U.S. Cl. .............. 257/310; 257/288; 257/368
(58) Field of Search ................. 257/310, 288, 257/368

(56) References Cited

U.S. PATENT DOCUMENTS

| | | | |
|---|---|---|---|
| 3,381,114 A | 4/1968 | Nakanuma | 219/385 |
| 4,215,156 A | 7/1980 | Dalal et al. | 427/84 |
| 4,333,808 A | 6/1982 | Bhattacharyya et al. | 204/192 D |
| 4,394,673 A | 7/1983 | Thompson et al. | 357/15 |
| 4,399,424 A | 8/1983 | Rigby | 338/34 |
| 4,413,022 A | 11/1983 | Suntola et al. | 427/255.2 |
| 4,590,042 A | 5/1986 | Drage | 422/186.06 |
| 4,647,947 A | 3/1987 | Takeoka et al. | 346/135.1 |
| 4,767,641 A | 8/1988 | Kieser et al. | 427/38 |
| 4,920,071 A | 4/1990 | Thomas | 437/188 |
| 4,993,358 A | 2/1991 | Mahawili | 118/715 |
| 5,006,192 A | 4/1991 | Deguchi | 156/345 |
| 5,055,319 A | 10/1991 | Bunshah et al. | 427/38 |
| 5,080,928 A | 1/1992 | Klinedinst et al. | 427/70 |
| 5,595,606 A | 1/1997 | Fujikawa et al. | 118/725 |
| 5,621,681 A | 4/1997 | Moon | 365/145 |
| 5,698,022 A | 12/1997 | Glassman et al. | |
| 5,735,960 A | 4/1998 | Sandhu et al. | 118/723 IR |
| 5,744,374 A | 4/1998 | Moon | 437/60 |
| 5,795,808 A | 8/1998 | Park | 438/301 |
| 5,801,105 A | 9/1998 | Yano et al. | 438/785 |
| 5,810,923 A | 9/1998 | Yano et al. | 117/84 |

(Continued)

FOREIGN PATENT DOCUMENTS

| | | | |
|---|---|---|---|
| JP | 62-199019 | 9/1987 | |
| JP | 5090169 | 4/1993 | |
| JP | 2001-332546 | 11/2001 | H01L/21/316 |

OTHER PUBLICATIONS

Aarik, Jaan , et al., "Atomic layer growth of epitaxial TiO/sub 2/ thin films from TiCl/sub 4/ and H/sub 2/O on alpha –Al/sub 2/O/sub 3/ substrates", *Journal Crystal Growth*, 242(1–2), (2002), 189–198.

(Continued)

*Primary Examiner*—Long Pham
(74) *Attorney, Agent, or Firm*—Schwegman, Lundberg, Woessner & Kluth, P.A.

(57) ABSTRACT

A gate oxide and method of fabricating a gate oxide that produces a more reliable and thinner equivalent oxide thickness than conventional $SiO_2$ gate oxides are provided. Gate oxides formed from yttrium, silicon, and oxygen are thermodynamically stable such that the gate oxides formed will have minimal reactions with a silicon substrate or other structures during any later high temperature processing stages. The process shown is performed at lower temperatures than the prior art, which inhibits unwanted species migration and unwanted reactions with the silicon substrate or other structures. Using a thermal evaporation technique to deposit the layer to be oxidized, the underlying substrate surface smoothness is preserved, thus providing improved and more consistent electrical properties in the resulting gate oxide.

19 Claims, 5 Drawing Sheets

U.S. PATENT DOCUMENTS

| | | | |
|---|---|---|---|
| 5,822,256 A | 10/1998 | Bauer et al. | 365/200 |
| 5,828,080 A | 10/1998 | Yano et al. | 257/43 |
| 5,840,897 A | 11/1998 | Kirlin et al. | 546/2 |
| 5,916,365 A | 6/1999 | Sherman | 117/92 |
| 5,950,925 A | 9/1999 | Fukunaga et al. | 239/132.3 |
| 5,972,847 A | 10/1999 | Feenstra et al. | 505/473 |
| 6,013,553 A | 1/2000 | Wallace et al. | 438/287 |
| 6,020,024 A | 2/2000 | Maiti et al. | 427/248.1 |
| 6,027,961 A | 2/2000 | Maiti et al. | 438/199 |
| 6,057,271 A | 5/2000 | Kenjiro et al. | 505/475 |
| 6,059,885 A | 5/2000 | Ohashi et al. | 118/730 |
| 6,093,944 A | 7/2000 | VanDover | 257/310 |
| 6,110,529 A | 8/2000 | Gardiner et al. | 427/250 |
| 6,161,500 A | 12/2000 | Kopacz et al. | 118/723 E |
| 6,171,900 B1 | 1/2001 | Sun | 438/240 |
| 6,203,613 B1 | 3/2001 | Gates et al. | 117/104 |
| 6,206,972 B1 | 3/2001 | Dunham | 118/715 |
| 6,207,589 B1 | 3/2001 | Ma et al. | 438/785 |
| 6,211,035 B1 | 4/2001 | Moise et al. | 438/396 |
| 6,225,168 B1 | 5/2001 | Gardner et al. | 438/287 |
| 6,232,847 B1 | 5/2001 | Marcy, 5th et al. | 331/167 |
| 6,281,144 B1 | 8/2001 | Cleary et al. | 438/780 |
| 6,291,866 B1 | 9/2001 | Wallace et al. | 257/410 |
| 6,297,516 B1 | 10/2001 | Forrest et al. | 257/40 |
| 6,297,539 B1 | 10/2001 | Ma et al. | 257/410 |
| 6,302,964 B1 | 10/2001 | Umotoy et al. | 118/715 |
| 6,303,481 B2 | 10/2001 | Park | 438/591 |
| 6,348,386 B1 | 2/2002 | Gilmer | 438/288 |
| 6,368,941 B1 | 4/2002 | Chen et al. | 438/424 |
| 6,380,579 B1 | 4/2002 | Nam et al. | 257/306 |
| 6,387,712 B1 | 5/2002 | Yano et al. | 438/3 |
| 6,391,769 B1 | 5/2002 | Lee et al. | 438/643 |
| 6,420,279 B1 | 7/2002 | Ono et al. | 438/785 |
| 6,432,779 B1 | 8/2002 | Hobbs et al. | 438/287 |
| 6,444,039 B1 | 9/2002 | Nguyen | 118/715 |
| 6,444,895 B1 | 9/2002 | Nikawa | 136/212 |
| 6,445,023 B1 | 9/2002 | Vaartstra et al. | 257/295 |
| 6,448,192 B1 | 9/2002 | Kaushik | 438/785 |
| 6,451,641 B1 | 9/2002 | Halliyal et al. | 438/200 |
| 6,451,695 B2 | 9/2002 | Sneh | 438/685 |
| 6,458,701 B1 | 10/2002 | Chae et al. | 438/680 |
| 6,465,334 B1 | 10/2002 | Buynoski et al. | 438/591 |
| 6,482,740 B2 | 11/2002 | Soininen et al. | 438/686 |
| 6,495,436 B2 | 12/2002 | Ahn et al. | 438/591 |
| 6,514,828 B2 | 2/2003 | Ahn et al. | 438/297 |
| 6,521,911 B2 | 2/2003 | Parsons et al. | 257/52 |
| 6,534,420 B2 | 3/2003 | Ahn et al. | 438/768 |
| 2001/0009695 A1 | 7/2001 | Saanila et al. | 427/255.39 |
| 2001/0051442 A1 | 12/2001 | Katsir et al. | 438/758 |
| 2001/0053082 A1 | 12/2001 | Chipalkatti et al. | 362/496 |
| 2002/0022156 A1 | 2/2002 | Bright | 428/698 |
| 2002/0089023 A1 | 7/2002 | Yu et al. | 257/411 |
| 2002/0119297 A1 | 8/2002 | Forrest et al. | 428/199 |
| 2002/0146916 A1 | 10/2002 | Irino et al. | 438/785 |
| 2002/0155688 A1 | 10/2002 | Ahn et al. | 438/592 |
| 2002/0155689 A1 | 10/2002 | Ahn et al. | 29/76 |
| 2002/0192974 A1 | 12/2002 | Ahn et al. | 438/722 |
| 2003/0001241 A1 | 1/2003 | Chakrabarti et al. | 257/643 |
| 2003/0003702 A1 | 1/2003 | Ahn et al. | 438/591 |
| 2003/0017717 A1 | 1/2003 | Ahn et al. | 438/768 |

OTHER PUBLICATIONS

Aarik, Jaan, et al., "Influence of substrate temperature on atomic layer growth and properties of HfO/sub 2/ thin films", *Thin Solid Films*, 340(1–2), (1999),110–116.

Aarik, Jaan, et al., "Phase transformations in hafnium dioxide thin films grown by atomic layer doposition at high temperatures", *Applied Surface Science*, 173(1–2), (Mar. 2001),15–21.

Aarik, Jaan, et al., "Texture Development in nanocrystalline hafnium dioxide thin films grown by atomic layer deposition", *Journal of Crystal Growth, 220,* (2000), 105–113.

Alen, Petra, "Atomic Layer deposition of Ta(Al)N(C) thin films using trimethylaluminum as a reducing agent", *Journal of the Electrochemical Society, 148(10),* (Oct. 2001), G566–G571.

Bendoraitis, J G., et al., "Optical energy gaps in the monoclinic oxides of hafnium and zirconium and their solid solutions", *Journal of Physical Chemistry, 69(10),* (1965), 3666–3667.

Bright, A A., et al., "Low–rate plasma oxidation of Si in a dilute oxygen/helium plasma for low–temperature gate quality Si/Sio2 interfaces", *Applied Physics Letters, 58(6),* (Feb. 1991),619–621.

Bunshah, Rointan F., et al., "Deposition Technologies for Films and Coatings: Developments and Applications", *Park Ridge, N.J., U.S.A. ; Noyes Publications,* (1982),102–103.

Cava, RJ., "Improvement of the dielectric properties of Ta/sub 2/O/sub 5/ through substitution with Al/sub 2/O/sub 3/", *Applied Physics Letters, 70(11),* (Mar. 1997),1396–8.

Chambers, J J., et al., "Physical and electrical characterization of ultrathin yttrium silicate insulators on silicon", *Journal of Applied Physics, 90(2),* (Jul. 15, 2001),918–33.

Cheng, Baohong, et al., "The Impact of High–k Gate Dielectrics and Metal Gate Electrodes on Sub–100nm MOSFET's", *IEEE Transactions on Electron Devices, 46(7),* (Jul. 1999), 1537–1544.

Copel, M., "Structure and stability of ultrathin zirconium oxide layers on Si(001)", *Applied Physics Letters, 76(4),* (Jan. 2000),436–438.

De Flaviis, Franco, et al., "Planar microwave integrated phase–shifter design with high purity ferroelectric material", *IEEE Transactions on Microwave Theory & Techniques, 45(6),* (Jun. 1997),963–969.

Desu, S B., "Minimization of Fatigue in Ferroelectric Films", *Physica Status Solidi A, 151(2),* (1995),467–480.

Dusco, C, et al., "Deposition of tin oxide into porous silicon by atomic layer epitaxy", *Journal of the Electrochemical Society, 143,* (1996),683–687.

El–Kareh, B, et al., "The evolution of DRAM cell technology", *Solid State Technology, 40(5),* (1997),89–90, 92, 95–6, 98, 100–1.

Engelhardt, M., "Modern Applications of Plasma Etching and Patterning in Silicon Process Technology", *Contributions to Plasma Physics, 39(5),* (1999),473–478.

Forsgren, Katarina, "Atomic Layer Deposition of HfO2 using hafnium iodide", *Conference held in Monterey, California,* (May 2001), 1 page.

Fuyuki, Takashi, et al., "Electronic Properties of the Interface between Si and TiO2 Deposited at Very Low Temperatures", *Japanese Journal of Applied Physics, Part 1 (Regular Papers & Short Notes), 25(9),* (Sep. 1986),1288–1291.

Fuyuki, Takashi, et al., "Initial stage of ultra–thin SiO/sub 2/ formation at low temperatures using activated oxygen", *Applied Surface Science,* 117–118, (Jun. 1997),123–126.

Gartner, M, et al., "Spectroellipsometric characterization of lanthanide–doped TiO2 films obtained via the sol–gel technique", *Thin Solid Films, 234(1–2),* (1993),561–565.

Geller, S., et al., "Crystallographic Studies of Perovskite–like Compounds. II. Rare Earth Aluminates", *Acta Cryst.,* 9, (May 1956),1019–1025.

Giess, E. A., et al., "Lanthanide gallate perovskite–type substates for epitaxial, high–T/sub c/ superconducting Ba/sub 2/YCu/sub 3/O/sub 7–delta / films", *IBM Journal of Research and Development*, 34(6), (Nov. 1990),916–926.

Guillaumot, B , et al., "75 nm damascene metal gate and high–k integration for advanced CMOS devices", *Technical Digest of International Electron Devices Meeting 2002*, (2002),355–358.

Gusev, E P., et al., "Ultrathin High–K Dielectrics Grown by Atomic Layer Deposition: A Comparative Study of ZrO2, HfO2, Y2O3 and Al2O3", *Eletrochemical Society Proceedings* vol. 2001–9, (2001)189–195.

Gutowski, M J., "Thermodynamic stability of high–K dielectric metal oxides ZrO/sub 2/ and HfO/sub 2/ in contact with Si and SiO/sub 2/", *Applied Physics Letters*, 80(11), (Mar. 18, 2002), 1897–1899.

Hirayama, Masaki , et al., "Low–Temperature Growth of High–Integrity Silicon Oxide Films by Oxygen Radical Generated in High Density Krypton Plasma", *International Electron Devices Meeting 1999, Technical Digest*, (1999), 249–252.

Hubbard, K. J., "Thermodynamic stability of binary oxides in contact with silicon", *Journal of Materials Research*, 11(11), (Nov. 1996),2757–2776.

Hunt, C. E., et al., "Direct bonding of micromachined silicon wafers for laser diode heat exchanger applications", *Journal of Micromechanics and Microengineering*, 1(3), (Sep. 1991), 152–156.

Iddles, D M., et al., "Relationships between dopants, microstructure and the microwave dielectric properties of ZrO2–TiO2–SnO2 ceramics", *Journal of Materials Science*, 27(23), (Dec. 1992),6303–6310.

Jeon, Sanghun , et al., "Excellent electrical characteristics of lanthanide (Pr, Nd, Sm, Gd, and Dy) oxide and lanthanide-doped oxide for MOS gate dielectric applications", *Electron Devices Meeting, 2001. IEDM Technical Digest. International*, (2000),471–474.

Jeong, Chang–Wook , et al., "Plasma–Assisted Atomic Layer Growth of High–Quality Aluminum Oxide Thin Films", *Japanese Journal of Applied Physics, Part 1: Regular Papers and Short Notes and Review Papers*, 40(1), (Jan. 2001),285–289.

Jung, H S., et al., "Improved current performance of CMOS-FETs with nitrogen incorporated HfO/sub 2/–Al/sub 3/ laminate gate dielectric", *Technical Digest of International Electron Devices Meeting 2002*, (2002),853–856.

Kang, L , et al., "MOSFET devices with polysilicon on single–layer HfO/sub 2/ high–K dielectrics", *International Electron Devices Meeting 2000. Technical Digest. IEDM*, (2000),35–8.

Kawai, Y, et al., "Ultra–low–temperature growth of high–integrity gate oxide films by low–energy Ion–assisted oxidation", *Applied Physics Letters*, 64(17), (Apr. 1994),2223–2225.

Keomany, D , et al., "Sol gel preparation of mixed cerium–titanium oxide thin films", *Solar Energy Materials and Solar Cells*, 33(4), (Aug. 1994),429–441.

Kim, Y W., et al., "50nm gate length logic technology with 9–layer Cu interconnects for 90nm node SoC applications", *Technical Digest of International Electron Devices Meeting 2002*, (2002),69–72.

Kim, C T., et al., "Application of Al2O3 Grown by Atomic Layer Deposition to DRAM and FeRAM", *International Symposium in Integrated Ferroelectrics*, (Mar. 2000),316.

Kim, D. , et al., "Atomic Control of Substrate Termination and Heteroepitaxial Growth of SrTiO3/LaAlO3 Films", *Journal of the Korean Physical Society*, 36(6), (Jun. 2000), 444–448.

Kim, Byoung–Youp , et al., "Comparison Study for TiN films deposited from different method: chemical vapor deposition and atomic layer deposition", *Mechanisms of Surface and Microstructure Evolution in Deposited Films and Film Structures Symposium (Materials Research Society Symposium Proceedings* vol. 672), (2001),7.8.1–7.8.6.

Kim, Taeseok , et al., "Correlation between strain and dielectric properties in ZrTiO/sub 4/ thin films", *Applied Physics Letters*, 76(21), (May 2000),3043–3045.

Kim, Taeseok , et al., "Dielectric properties and strain analysis in paraelectric ZrTiO/sub 4/ thin films deposited by DC magnetron sputtering", *Japanese Journal of Applied Physics Part 1–Regular Papers Short Notes & Review Papers*, 39(7A), (2000),4153–4157.

Kim, Yongjo , et al., "Effect of microstructures on the microwave dielectric properties of ZrTiO/sub 4/ thin films", *Applied Physics Letters*, 78(16), (Apr. 16, 2001),2363–2365.

Kim, Y , et al., "Substrate dependence on the optical properties of Al/sub 2/O/sub 3/ films grown by atomic layer deposition", *Applied Physics Letters*, 71(25, 22 ), (Dec. 1997),3604–3606.

Krauter, G. , et al., "Room Temperature Silicon Wafer Bonding with Ultra–Thin Polymer Films", *Advanced Materials*, 9(5), (1997),417–420.

Kukli, Kaupo , "Atomic Layer Deposition of Titanium Oxide from TiI4 and H2O2", *Chemical Vapor Deposition*, 6(6), (2000),303–310.

Kukli, K , et al., "Comparison of hafnium oxide films grown by atomic layer deposition from iodide and chloride and chloride precursors", *Thin Solid Films*, 416,(2002),72–79.

Kukli, K , et al., "Controlled growth of yttrium oxysulphide thing films by atomic layer deposition", *Materials Science Forum*, 315–317, (1999),216–221.

Kukli, Kaupo , "Dielectric Properties of Zirconium Oxide Grown by Atomic Layer Deposition from Iodide Precursor", *Journal of The Electrochemical Society*, 148(12), (2001), F227–F232.

Kukli, Kaupo , et al., "Influence of thickness and growth temperature of the properties of zirconium oxide films growth by atomic layer deposition on silicon", *Thin Solid Films*, 410(1–2), (2002),53–60.

Kukli, Kaupo , et al., "Low–Temperature Deposition of Zirconium Oxide–Based Nanocrystalline Films by Alternate Supply of Zr[OC(CH3)3]4 and H2O", *Chemical Vapor Deposition*, 6(6), (2000),297–302.

Kukli, K J., et al., "Properties of hafnium oxide films grown by atomic layer deposition from hafnium tetraiodide and oxygen", *Journal of Applied Physics*, 92(10), (Nov. 15, 2002),5698–5703.

Lee, Byoung H., et al., "Characteristics of TaN gate MOS-FET with ultrathin hafnium oxide (8 A–12 A)", *Electron Devices Meeting, 2000, IEDM Technical Digest. International*, (2000),39–42.

Lee, A E., et al., "Epitaxyially grown sputtered LaAlO3 films", *Applied Physics Letters*, 57(19), (Nov. 1990),2019–2021.

Lee, S J., et al., "High quality ultra thin CVD HfO2 gate stack with poly–Si gate electrode", *Electron Devices Meeting, 2000. IEDM Technical Digest. International*, (2000), 31–34.

Lee, Cheng–Chung, et al., "Ion–assisted deposition of silver thin films", *Thin Solid Films, 359(1)*, (Jan. 2000),95–97.

Lee, Jung–Hyoung, et al., "Mass production worthy HfO/sub 2/–Al/sub 2/O/sub 3/ laminate capacitor technology using Hf liquid precursor for sub–100 nm DRAMs", *Electron Devices Meeting, 2002. IEDM '02. Digest. International*, (2002),221–224.

Lee, Dong H., et al., "Metalorganic chemical vapor deposition of TiO/sub 2/:N anatase thin film on Si substrate", *Applied Physics Letters, 66(7)*, (Feb. 1995),815–816.

Lee, L P., et al., "Monolithic 77 K dc SQUID magnetometer", *Applied Physics Letters, 59(23)*, (Dec. 1991),3051–3053.

Lee, C. H., et al., "MOS Characteristics of Ultra Thin Rapid Thermal CVD ZrO2 and Zr Silicate Gate Dielectrics", *Electron Devices Meeting, 2000. IEDM Technical Digest. International*, (2000),27–30.

Lee, C. H., et al., "MOS Devices with High Quality Ultra Thin CVD ZrO2 Gate Dielectrics and Self–Aligned TaN and TaN/Poly–Si Gate electrodes", *2001 Symposium on VLSI, Technology Digest of Technicl Papers*, (2001),137–138.

Lee, Byoung H., et al., "Ultrathin Hafnium Oxide with Low Leakage and Excellent Reliability for Alternative Gate Dielectric Application", *Technical Digest of IEDM*, (1999), 133–136.

Leskela, M, et al., "ALD precursor chemistry: Evolution and future challenges", *Journal de Physique IV (Proceedings), 9(8)*, (Sep. 1999),837–852.

Liu, C. T., "Circuit Requirement and Integration Challenges of Thin Gate Dielectrics for Ultra Small MOSFETs", *International Electron Devices Meeting 1998. Technical Digest*, (1998),747–750.

Liu, Y C., et al., "Growth of ultrathin SiO/sub 2/ on Si by surface irradiation with an O/sub 2/+Ar electron cyclotron resonance microwave plasma at low temperatures",*Journal of Applied Physics, 85(3)*, (Feb. 1999),1911–1915.

Lucovsky, G, et al., "Microscopic model for enhanced dielectric constants in low concentration SiO/sub 2/–rich noncrystalline Zr and Hf silicate alloys", *Applied Physics Letters, 77(18)*, (Oct. 2000).2912–2914.

Luo, Z J., et al., "Ultra–thin ZrO2 (or Silicate) with High Thermal Stability for CMOS GAte Applications", *2001 Symposium on VLSI Technology Digest of Technical Papers*, (2001),135–136.

Martin, P J., et al., "Ion–beam–assisted deposition of thin films", *Applied Optics, 22(1)*, (Jan. 1983),178–184.

Molodyk, A A., et al., "Volatile Surfactant–Assisted MOCVD: Application to LaAlO3 Thin Film Growth", *Chemical Vapor Deposition, 6(3)*, (Jun. 2000),133–138.

Molsa, Heini, et al., "Growth of yttrium oxide thin films from beta –diketonate precursor", *Advanced Materials for Optics and Electronics, 4(6)*, (Nov.–Dec. 1994),389–400.

Muller, D. A., "The electronic structure at the atomic scale of ultrathin gate oxides", *Nature, 399(6738)*, (Jun. 24, 1999),758–61.

Nakagawara, Osamu, et al., "Electrical properties of (Zr, Sn)TiO4 dielectric thin film prepared by pulsed laser deposition", *Journal of Applied Physics, 80(1)*, (Jul. 1996), 388–392.

Nakajima, Anri, et al., "Atomic–layer deposition of ZrO/sub 2/ with a Si nitride barrier layer", *Applied Physics Letters, 81(15)*, (Oct. 2002),2824–2826.

Nakajima, Anri, et al., "NH/sub 3/–annealed atomic–layer–deposited silicon nitride as a high–k gate dielectric with high reliability", *Applied Physics Letters, 80(7)*, (Feb. 2002), 1252–1254.

Neumayer, D A., et al., "Materials characterization of ZrO/sub 2/–SiO/sub 2/ and HfO/sub 2/–sub 2/ binary oxides deposited by chemical solution deposition", *Journal of Applied Physics, 90(4)*, (Aug. 15, 2001),1801–1808.

Nieminen, Minna, et al., "Formation and stability of lanthanum oxide thin films deposited from B–diketonate precursor", *Applied Surface Science, 174(2)*, (Apr. 16, 2001), 155–165.

Niilisk, A, "Atomic–scale optical monitoring of the initial growth of TiO2 thin films", *Proceedings of the SPIE—The International Society for Optical Engineering, 4318*, (2001), 72–77.

Oates, D E., et al., "Surface impedance measurements of YBa/sub 2/Cu/sub 3/O/sub 7–x/ thin films in stripline resonators", *IEEE Transactions on Magnetics*, vol. 27, No. 2, pt.2, (Mar. 1991),867–871.

Oh, C B., et al., "Manufacturable embedded CMOS 6T–SRAM technology with high–k gate dielectric device for system–on–chip applications", *Technical Digest of International Electron Devices Meeting 2002*, 423–426.

Ohring, Milton, "The Materials Science of Thin Films", *Boston : Academic Press*, (1992),118,121,125.

Osten, H. J., et al., "High–k gate dielectric with ultra–low leakage current based on praseodymium oxide", *International Electron Devices Meeting 2000. Technical Digest. IEDM*. (2000),653–656.

Pan, Tung M., et al., "High quality ultrathin CoTiO/sub 3/ high–k gate dielectrics", *Electrochemical and Solid–State Letters, 3(9)*, (Sep. 2000),433–434.

Pan, Tung M., et al., "High–k cobalt–titanium oxide dielectrics formed by oxidation of sputtered Co/Ti or Ti/Co films", *Applied Physics Letters, 78(10)*, (Mar. 5, 2001),1439–1441.

Park, Jaehoo, et al., "Chemical vapor deposition of HfO/sub 2/ thin films using a novel carbon–free precursor: characterization of the interface with the silicon substrate",*Journal of the Electrochemical Society, 149(1)*, (2002),G89–G94.

Park, Byung–Eun, et al., "Electrical properties of LaAlO3/Si and Sr0.8Bi2.2Ta2O9/LaAlO3/Si structures", *Applied Physics Letters, 79(6)*, (Aug. 2001),806–808.

Perkins, Charles M., et al., "Electrical and materials properties of ZrO2 gate dielectrics grown by atomic layer chemical vapor deposition", *Applied Physics Letters, 78(16)*, (Apr. 2001),2357–2359.

Poveshchenko, V P., et al., "Investigation of the phas composition of films of zirconium, hafnium and yttrium oxides", *Soviet Journal of Optical Technology, 51(5)*, (1984),277–279.

Qi, Wen–Jie, et al., "MOSCAP and MOSFET characteristics using ZrO2 gate dielectric deposited directly on Si", *Electron Devices Meeting, 1999. IEDM Technical Digest. International*, (1999),145–148.

Qi, Wen–Jie, et al., "Performance of MOSFETs with ultra thin ZrO/sub 2/ and Zr silicate gate dielectrics", *2000 Symposium on VLSI Technology. Digest of Technical Papers*, (2000),40–41.

Rahtu, Antti, et al., "Atomic Layer Deposition of Zirconium Titanium Oxide from Titanium Isopropoxide and Zirconium Chloride", *Chemistry of Materials, 13(5)*, (May 2001),1528–1532.

Ramakrishnan, E S., et al., "Dielectric properties of radio frequency magnetron sputter deposited zirconium titanate–based thin films", *Journal of the Electrochemical Society, 145(1)*, (Jan. 1998),358–362.

Rayner Jr., G, et al., "The structure of plasma–deposited and annealed pseudo–binary ZrO2–SiO2 alloys", *Materials Research Society Symposium—Proceedings, 611*, (2000), C131–C139.

Ritala, Mikko, "AtomicLayer Epitaxy Growth of Titanium, Zirconium and Hafnium Dioxide Thin Films", *Annales Academiae Scientiarum Fennicae*, (1994),24–25.

Ritala, Mikko, et al., "Zirconium dioxide thin films deposited by ALE using zirconium tetrachloride as precursor", *Applied Surface Science*, 75(Jan. 1994),333–340.

Robertson, J., "Band offsets of wide–band–gap oxides and implications for future electronic devices", *Journal of Vacuum Science & Technology B (Microelectronics and Nanometer Structures)*, 18(3), (May–Jun. 2000),1758–1791.

Rossnagel, S M., et al., "Plasma–enhanced atomic layer deposition of Ta and Ti for Interconnect diffusion barriers", *Journal of Vacuum Science & Technology B (Microelectronics and Nanometer Structures)*, 18(4), (Jul. 2000),2016–2020.

Rotondaro, A L., et al., "Advanced CMOS Transistors with a Novel HfSiON Gate Dielectric", *Symposium on VLSI Technology Digest of Technical Papers*, (2002),148–149.

Saito, Yuji, et al., "Advantage of Radical Oxidation for Improving Reliability of Ultra–Thin Gate Oxide", *2000 Symposium on VLSI Technology Digest of Technical Papers*, (2000),176–177.

Saito, Yuji, et al., "High–Integrity Silicon Oxide Grown at Low–Temperature by Atomic Oxygen Generated in High–Density Krypton Plasma", *Extended Abstracts of the 1999 International Conference on Solid State Devices and Materials*, (1999),152–153.

Semiconductor Industry Associati, "International Technology for Semiconductor Roadmap", http://public.itrs.net/Files/2001ITRS/Links/1999 SIA Roadmap/, (1999).

Shanware, A, et al., "Reliability evaluation of HfSiON gate dielectric film with 12.8 A SiO2 equivalent thickness", *International Electron Devices Meeting, Technical Digest*, (2001),6.6.1–6.6.4.

Shin, Chang H., et al., "Fabrication and Characterization of MFISFET using Al2O3 Insulating Layer for Non–Volatile Memory", *12th International Symposium in Integrated Ferroelectrics*, (Mar. 2000),1–9.

Sneh, Ofer, "Thin film atomic layer deposition equipment for semiconductor processing", *Thin Solid Films, 402(1–2)*, (Jan. 2002),248–261.

Song, Hyun–Jung, et al., "Atomic Layer Deposition of Ta2O5 Films Using Ta(OC2H5)5 and NH3", *Ultrathin SiO/sub 2/and High–K Materials for ULSI Gate Dielectrics. Symposium*, (1999),469–471.

Stathis, J. H., et al., "Reliability Projection for Ultra–Thin Oxides at Low Voltage", *Tech. Dig. International Electron Device Meeting*, (1998),167–9.

Suntola, T, "Atomic layer epitaxy", *Thin Solid Films, 216(1)*, (Aug. 28, 1992),84–89.

Suntola, T., "Atomic Layer Epitaxy", *Handbook of Crystal Growth, 3; Thin Films of Epitaxy, Part B: Growth Mechanics and Dynamics*, Amsterdam,(1994),602–663.

Sze, S M., "Physics of Semiconductor Devices", *New York: Wiley*, (1981),431.

Sze, S M., "Physics of Semiconductor Devices", *New York: Wiley*, (1981),473.

Takemoto, J. H., et al., "Microstrip Resonators and Filters Using High–TC Superconducting Thin Films on LaAlO3", *IEEE Transaction on Magnetics, 27(2)*, (Mar. 1991),2549–2552.

Tarre, A, et al., "Comparative study of low–temperature chloride atomic–layer chemical vapor deposition of TiO2 and SnO2", *Applied Surface Science, 175–176*, (May 2001), 111–116.

Tavel, B, et al., "High performance 40 nm nMOSFETs with HfO/sub 2/gate dielectric and polysilicon damascene gate", *Technical Digest of International Electron Devices Meetings 2002*, (2002),429–432.

Van Dover, R. B., et al., "Amorphous Lanthanide–doped TiOx dielectric films", *Applied Physics Letters, 74(20)*, (May 17, 1999),3041–3043.

Van Dover, Robert B., et al., "Deposition of Uniform Zr–Sn–Ti–O films by ON–Axis Reactive Sputtering", *IEEE Electron Device Letters, 19(9)*, (Sep. 1998),329–331.

Van Dover, R B., et al., "Deposition of Uniform Zr–Sn–Ti–O Films by On–Axis Reactive Sputtering", *IEEE Electron Device Letters, 19(9)*, (Sep. 1998),329–331.

Van Dover, R. B., et al., "Discovery of a useful thin–film dielectric using a composition–spread approach", *Nature, 392*, (Mar. 12, 1998),162–164.

Viirola, H, "Controlled growth of antimony–doped tin dioxide thin films by atomic layer epitaxy", *Thin Solid Films, 251*, (Nov. 1994),127–135.

Viirola, H, "Controlled growth of tin oxide thin films by atomic layer epitxy", *Thin Solid Films, 249(2)*, (Sep. 1994), 144–149.

Visokay, M R., "Application of HfSiON as a gate dielectric material", *Applied Physics Letters, 80(17)*, (Apr. 2002), 3183–3185.

Wilk, G D., "Hafnium and zirconium silicates for advanced gate dielectrics", *Journal of Applied Physics, 87(1)*,(Jan. 2000),484–492.

Wilk, G. D., "High–K gate dielectrics: Current status and materials properties considerations", *Journal of Applied Physics, 89(10)*, (2001),5243–5275.

Wolf, Stanley, et al., "Future Trends in Sputter Deposition Processes", *In: Silicon Processing of the VLSI Era*, vol. 1, Lattice Press,(1986),374–380.

Wolf, Stanley, et al., "Silicon Processing for the VLSI Era—vol. 1: Process Technology", *Second Edition, Lattice Press*, Sunset Beach, California,(2000),443.

Wolfram, G, et al., "Existence range, structural and dielectric properties of ZrxTiySnzO4 ceramics (x+y=2)", *Materials Research Bulletin, 16(11)*, (Nov. 1981),1455–63.

Yamaguchi, Takeshi, "Band Diagram and Carrier Conduction Mechanism in ZrO2/Zr–silicate/Si MIS Structure Fabricated by Pulsed–laser–ablation Deposition", *Electron Devices Meeting, 2000. IEDM Technical Digest. International*, (2000),19–22.

Yamaguchi, Takeshi, et al., "Study on Zr–Silicate Interfacial Layer of ZrO2–MIS Structure FAbricated by Pulsed Laer Ablation Deposition Method", *Solid State Devices and Materials*, (2000),228–229.

Zhang, H., "Atomic Layer Deposition of High Dielectric Constant Nanolaminates", *Journal of The Electrochemical Society, 148(4)*, (Apr. 2001),F63–F66.

Zhang, H, "High permittivity thin film nanolaminates", *Journal of Applied Physics, 87(4)*, (Feb. 2000),1921–1924.

Zhu, W, et al., "HfO2 and HfAlO for CMOS: Thermal Stability and Current Transport", *IEEE International Electron Device Meeting 2001*, (2001),463–466.

Zucker, O, et al., "Application of Oxygen Plasma Processing to Silicon Direct Bonding", *Sensors and Actuators A, 36*, (1993),227–231.

EVAPORATION OF Y-SI-O FILMS FOR MEDIUM-K DIELECTRICS

RELATED APPLICATIONS

This application is a divisional of U.S. application Ser. No. 10/099,194 filed Mar. 13, 2002 now U.S. Pat. No. 6,812,100 which is incorporated herein by reference.

FIELD OF THE INVENTION

The invention relates to semiconductor devices and device fabrication. Specifically, the invention relates to gate oxide layers of transistor devices and their method of fabrication.

BACKGROUND OF THE INVENTION

In the semiconductor device industry, particularly in the fabrication of transistors, there is continuous pressure to reduce the size of devices such as transistors. The ultimate goal is to fabricate increasingly smaller and more reliable integrated circuits (ICs) for use in products such as processor chips, mobile telephones, or memory devices such as DRAMs. The smaller devices are frequently powered by batteries, where there is also pressure to reduce the size of the batteries, and to extend the time between battery charges. This forces the industry to not only design smaller transistors, but to design them to operate reliably with lower power supplies.

A common configuration of a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. The transistor 100 is fabricated in a substrate 110 that is typically silicon, but could be fabricated from other semiconductor materials as well. The transistor 100 has a first source/drain region 120 and a second source/drain region 130. A body region 132 is located between the first source/drain region and the second source/drain region, the body region 132 defining a channel of the transistor with a channel length 134. A gate dielectric, or gate oxide 140 is located on the body region 132 with a gate 150 located over the gate oxide. Although the gate dielectric can be formed from materials other than oxides, the gate dielectric is typically an oxide, and is commonly referred to as a gate oxide. The gate may be fabricated from polycrystalline silicon (polysilicon) or other conducting materials such as metal may be used.

In fabricating transistors to be smaller in size and reliably operating on lower power supplies, one important design criteria is the gate oxide 140. A gate oxide 140, when operating in a transistor, has both a physical gate oxide thickness and an equivalent oxide thickness (EOT). The equivalent oxide thickness quantifies the electrical properties, such as capacitance, of a gate oxide 140 in terms of a representative physical thickness. EOT is defined as the thickness of a theoretical $SiO_2$ layer that describes the actual electrical operating characteristics of the gate oxide 140 in the transistor 100. For example, in traditional $SiO_2$ gate oxides, a physical oxide thickness may be 5.0 nm, but due to undesirable electrical effects such as gate depletion, the EOT may be 6.0 nm. A gate oxide other than $SiO_2$ may also be described electrically in terms of an EOT. In this case, the theoretical oxide referred to in the EOT number is an equivalent $SiO_2$ oxide layer. For example, $SiO_2$ has a dielectric constant of approximately 4. An alternate oxide with a dielectric constant of 20 and a physical thickness of 100 nm would have an EOT of approximately 20 nm=(100*(4/20)), which represents a theoretical $SiO_2$ gate oxide.

Lower transistor operating voltages and smaller transistors require thinner equivalent oxide thicknesses (EOTs). A problem with the increasing pressure of smaller transistors and lower operating voltages is that gate oxides fabricated from $SiO_2$ are at their limit with regards to physical thickness and EOT. Attempts to fabricate $SiO_2$ gate oxides thinner than today's physical thicknesses show that these gate oxides no longer have acceptable electrical properties. As a result, the EOT of a $SiO_2$ gate oxide 140 can no longer be reduced by merely reducing the physical gate oxide thickness.

Attempts to solve this problem have led to interest in gate oxides made from oxide materials other than $SiO_2$. Certain alternate oxides have a higher dielectric constant (k), which allows the physical thickness of a gate oxide 140 to be the same as existing $SiO_2$ limits or thicker, but provides an EOT that is thinner than current $SiO_2$ limits.

A problem that arises in forming an alternate oxide layer on the body region of a transistor is the process in which the alternate oxide is formed on the body region. Recent studies show that the surface roughness of the body region has a large effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness. In forming an alternate oxide layer on the body region of a transistor, a thin layer of the alternate material to be oxidized (typically a metal) must first be deposited on the body region. Current processes for depositing a metal or other alternate layer on the body region of a transistor are unacceptable due to their effect on the surface roughness of the body region.

FIG. 2A shows a surface 210 of a body region 200 of a transistor. The surface 210 in FIG. 2A has a high degree of smoothness, with a surface variation 220. FIG. 2B shows the body region 200 during a conventional sputtering deposition process stage. During sputtering, particles 230 of the material to be deposited bombard the surface 210 at a high energy. When a particle 230 hits the surface 210, some particles adhere as shown by particle 235, and other particles cause damage as shown by pit 240. High energy impacts can throw off body region particles 215 to create the pits 240. A resulting layer 250 as deposited by sputtering is shown in FIG. 2C. The deposited layer/body region interface 255 is shown following a rough contour created by the sputtering damage. The surface of the deposited layer 260 also shows a rough contour due to the rough interface 255.

In a typical process of forming an alternate material gate oxide, the deposited layer 250 is oxidized to convert the layer 250 to an oxide material. Existing oxidation processes do not, however, repair the surface damage created by existing deposition methods such as sputtering. As described above, surface roughness has a large influence on the electrical properties of the gate oxide and the resulting transistor.

What is needed is an alternate material gate oxide that is more reliable at existing EOTs than current gate oxides. What is also needed is an alternate material gate oxide with an EOT thinner than conventional $SiO_2$. What is also needed is an alternative material gate oxide with a smooth interface between the gate oxide and the body region. Because existing methods of deposition are not capable of providing a smooth interface with an alternate material gate oxide, what is further needed is a method of forming an alternate material gate oxide that maintains a smooth interface.

Additionally, at higher process temperatures, any of several materials used to fabricate the transistor, such as silicon, can react with other materials such as metals or oxygen to form unwanted silicides or oxides. At high process temperatures, materials such as dopants can also migrate to unwanted areas, changing the desired structure or composition profile that is desired. What is needed is a lower temperature process of forming gate oxides that prevents migration and the formation of unwanted byproduct materials.

SUMMARY OF THE INVENTION

A method of forming a gate oxide on a surface such as a transistor body region is shown. The method includes evaporation depositing a metal on the body region and additionally evaporation depositing a metal oxide on the body region. In one embodiment of the invention, the metal includes yttrium, and the metal oxide includes silicon dioxide ($SiO_2$). In one embodiment, the metal and the metal oxide are evaporated concurrently in a single processing step.

In addition to the novel process of forming a gate oxide layer, a transistor formed by the novel process exhibits novel features that may only be formed by the novel process. Evaporation deposition of a metal, and further evaporation deposition of a metal oxide onto a body region of a transistor preserves an original smooth surface roughness of the body region in contrast to other prior deposition methods that increase surface roughness. When yttrium and silicon oxide starting materials are included, the resulting transistor fabricated with the process of this invention will exhibit a gate oxide/body region interface with a surface roughness variation as low as 0.6 nm. An equivalent oxide thickness (EOT) of less than 2 nm can be formed using the novel process described. The resulting transistor fabricated with the process of this invention further allows a gate oxide purity of 99.9999% or greater. The resulting transistor fabricated with the process of this invention further allows a yttrium-silicon oxide layer to be formed in direct interfacial contact with the body region.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1:
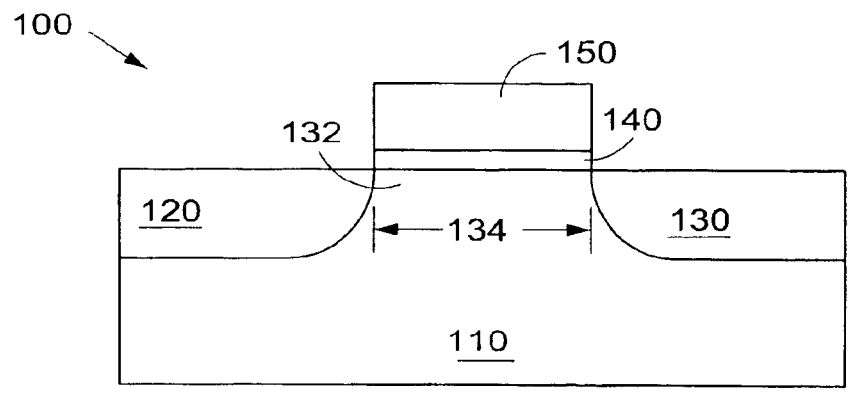
FIG. 1 shows a common configuration of a transistor.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 3:
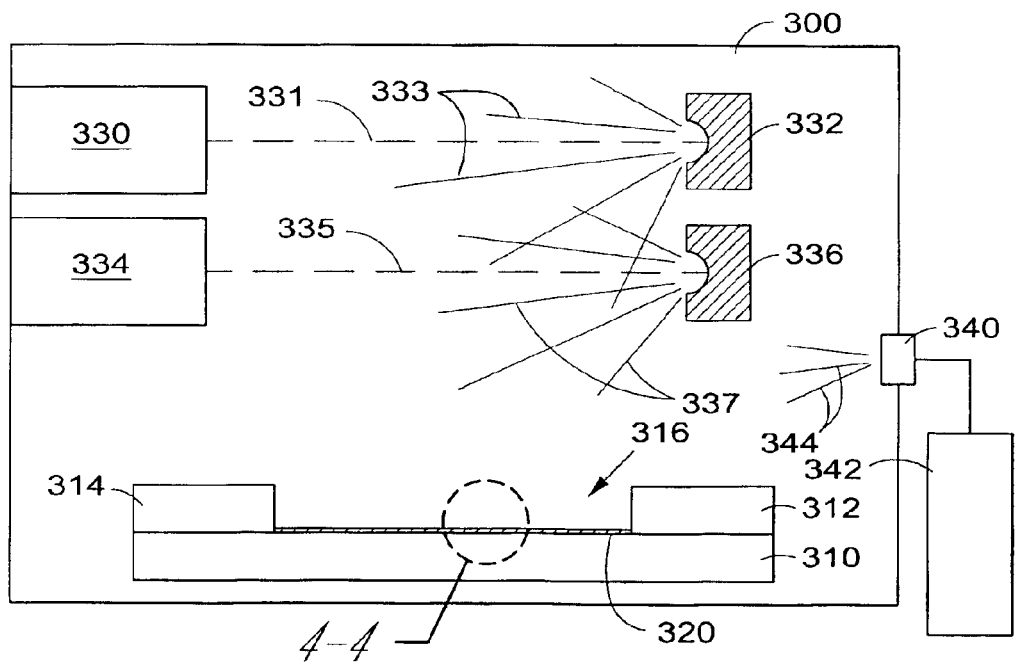
FIG. 3 shows a deposition process according to the invention.

FIG. 3 shows an electron beam evaporation technique to deposit a material on a surface such as a body region of a transistor. In FIG. 3, a substrate 310 is placed inside a deposition chamber 300. The substrate in this embodiment is masked by a first masking structure 312 and a second masking structure 314. In this embodiment, the unmasked region 316 includes a body region of a transistor, however one skilled in the art will recognize that other semiconductor device structures may utilize this process.

Also located within the deposition chamber 300 is a first electron beam source 330, a first target 332, a second electron beam source 334, and a second target 336. The multiple target configuration shown allows for compositional tuning of a number of components of the deposited material. For example, in one embodiment adjustments are available for the first target 332 evaporation rate and the second target 336 evaporation rate. The rates can be adjusted separately, allowing greater flexibility in tuning a composition of a product film 320. Although a multiple target configuration is shown in FIG. 3, a single target fabricated to a desired composition can also be used within the scope of the invention.

Additionally, in one embodiment, a leak valve 340 is included in the evaporation chamber 300. The leak valve 340 in one embodiment is connected to a source gas 342 such as oxygen. The leak valve 340 provides another possible variable for use in tuning the composition of the product film 320.

In one embodiment, the first target 332 is a single element target, and the second target is a compound target. One skilled in the art, after reading the present specification will recognize that several compositions, including single element, dual element compound, or multiple element compound are possible for use in either the first target 332, the second target 336, or both targets.

Although in this embodiment, an electron beam evaporation technique is used, it will be apparent to one skilled in the art that other thermal evaporation techniques can be used without departing from the scope of the invention.

During the evaporation process, the first electron beam source 330 generates a first electron beam 331. The first electron beam 331 hits the first target 332 and heats a portion of the first target 332 enough to cause the surface of the target to evaporate. The evaporated material 333 is then distributed throughout the chamber 300, and the material 333 deposits on surfaces that it contacts, such as the exposed body region 316. The depositing material 333 forms a portion of a composition in the product film 320. The portion of the product film 320 being supplied by the first target 332 is chemically substantially the same as the target 332.

In one embodiment, a target material includes a metal oxide. When some metal oxides are evaporated, the oxygen composition ratio in the product film 320 varies from the target oxygen composition ratio. The leak valve 340 may be used to adjust a variable such as oxygen composition during evaporation deposition. In this way, the oxygen composition ratio can either be adjusted back to the target oxygen composition ratio, or the oxygen composition in the product film 320 may be further varied to a new desired composition ratio.

Also during the evaporation process, the second electron beam source 334 generates a second electron beam 335. The second electron beam 335 hits the second target 336 and heats a portion of the second target 336 enough to cause the surface of the target to evaporate. The evaporated material 337 is then distributed throughout the chamber 300, and the material 337 deposits on surfaces that it contacts, such as the exposed body region 316. The depositing material 337 also forms a portion of a composition in the product film 320. The portion of the product film 320 being supplied by the second target 336 is chemically substantially the same as the target 336.

In one embodiment, the evaporation process is performed at a background pressure of approximately $1 \times 10^{-7}$ torr. In one embodiment targets are preheated for several minutes before the evaporation process begins. One typical evaporation rate for this process includes a rate of 1 to 10 nm/second. A device such as a quartz crystal microbalance is used to assist monitoring of the deposition process in one embodiment.

In one embodiment of the invention, the product film 320 includes multiple metals. In one embodiment of the invention, the product film 320 includes yttrium (Y) and silicon (Si). In one embodiment of the invention, the first target 330 is a single element yttrium metal target, and the second target 334 is a compound target of silicon dioxide ($SiO_2$). One advantage of the thermal evaporation process is the high purity targets that are available for the process. Zone refined targets have purity as high as 99.9999%. Additionally, the evaporation process itself further purifies the target materials thus increasing the final purity of the film 320 beyond even the target purity. The more violent nature of other deposition methods such as sputtering tends to mix impurities into the deposited layer during deposition. Therefore a uniquely pure product film 320 is possible using this novel method.

The deposition process described is capable of forming multiple element product films 320 in a single processing step. This saves manufacturing resources and time. The deposition process described is further capable of forming a metal oxide without consuming the surface or substrate 310 that the film 320 is deposited on.

The choice of materials for oxidation is based on the properties of the oxide formed. Considerations included the thermodynamic stability of the oxide with silicon, the diffusion coefficient of the oxide at high processing temperatures such as 1000° K, the lattice match of the oxide with silicon, the dielectric constant of the oxide, and the conduction band offset of the oxide.

Many high-k materials such as $Ta_2O_5$, $TiO_2$, and $SrTiO_3$ are not thermally stable when directly in contact with silicon. These materials need a diffusion barrier which not only adds process complexity, but also defeats the purpose of using the high-k dielectric. Also materials having too high or too low a dielectric constant (k) may not be appropriate. Ultra high-k materials such as $SrTiO_3$ cause fringing field induced barrier lowering effects. On the other hand, low dielectric constant (k) materials such as $Al_2O_3$ do not significantly improve the equivalent oxide thickness (EOT). Where as in the present invention, product films composed of yttrium-silicon-oxide exhibit a medium dielectric constant of approximately 14.

In one embodiment, the dielectric constant of the product film 320 is approximately 14, which is approximately 3.5 times the dielectric constant of $SiO_2$. In one embodiment, the product film 320 is substantially amorphous. A lower presence of grain boundaries in the substantially amorphous material layer 320 reduces the leakage current through the final gate oxide. Although the amorphous form is preferred, the product film is also acceptable with some percentage of crystalline form.

Figure 2A:
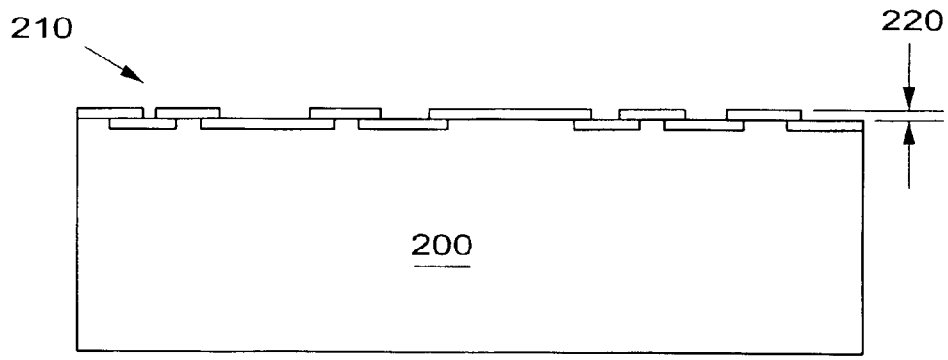
FIG. 2A shows a smooth surface of a body region of a transistor.
Figure 2B:
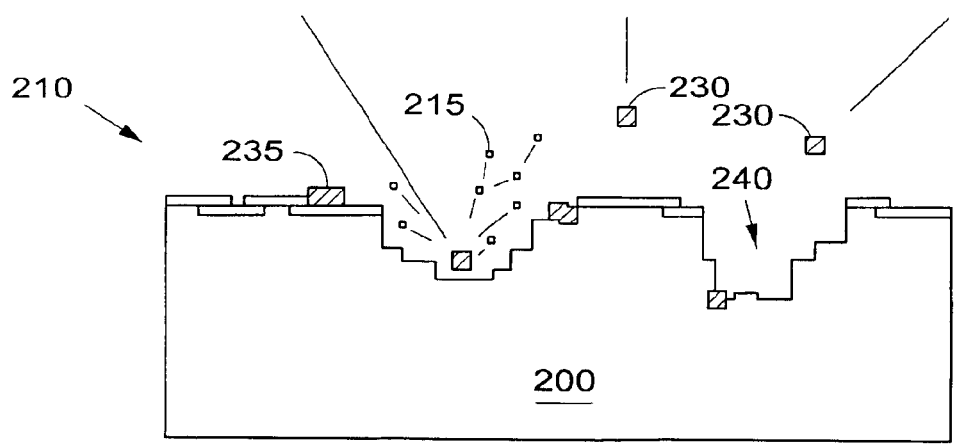
FIG. 2B shows a deposition process according to the prior art.
Figure 2C:
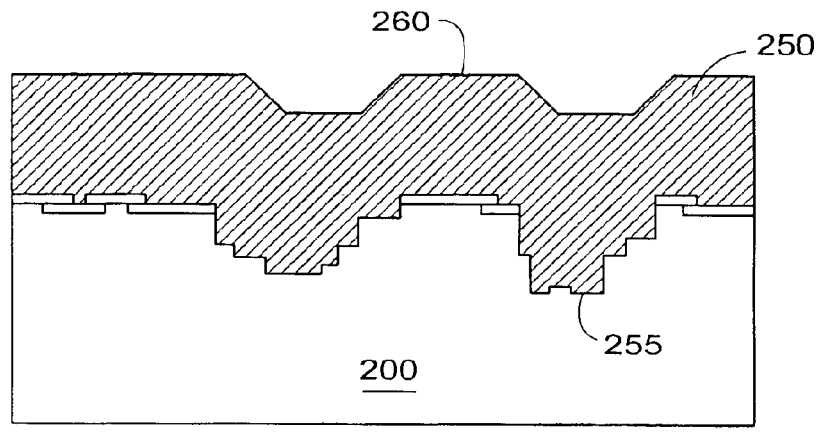
FIG. 2C shows a deposited film on a body region according to the prior art.

A thermal evaporation process such as the electron beam evaporation technique described above does not cause the surface damage that is inherent in other deposition techniques such as the sputtering technique shown in FIG. 2B. This allows a very thin layer of material to be deposited on a body region of a transistor, while maintaining a smooth interface. A thermal evaporation process such as the electron beam evaporation technique described above also allows low processing temperatures that inhibit the formation of unwanted byproducts such as silicides and oxides. In one embodiment, the thermal evaporation is performed with a substrate temperature between approximately 100 and 150° C.

Figure 4:
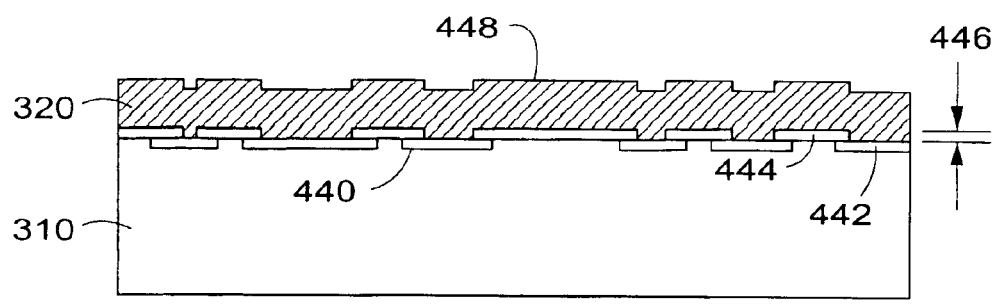
FIG. 4 shows a magnified view of a deposited film on a body region from FIG. 3.

FIG. 4 shows a magnified view of the body region 316 and the product film 320 from FIG. 3. The interface 440 is shown with a roughness variation 446. The surface 448 of the product film 320 is also shown with a similar surface roughness. One possible surface variation 446 would be an atomic layer variation. In atomic smoothness, the greatest difference in surface features is between a first atomic layer as indicated by layer 442 and a second atomic layer 444. The thermal evaporation deposition technique described above preserves atomic smoothness such as is shown in FIG. 4, however other acceptable levels of surface roughness greater than atomic smoothness will also be preserved by the thermal evaporation technique. Using the deposition process described above, no additional layers such as silicon dioxide ($SiO_2$) layers are interposed between the product film 320 and the substrate 310. The product film 320 forms a direct interface with the substrate 310.

As stated above, the yttrium-silicon-oxide exhibits a dielectric constant of approximately 14, which allows for a thinner EOT than conventional $SiO_2$. In addition to the stable thermodynamic properties inherent in the oxides chosen, the novel process used to form the product layer 320 is performed at lower temperatures than the prior art. This inhibits reactions with the silicon substrate or other structures, and inhibits unwanted migration of elements such as dopants. In the manufacturing process of one embodiment, no subsequent oxidation steps are required after evaporation deposition.

A transistor made using the novel gate oxide process described above will possess several novel features. By creating an oxide material with a higher dielectric constant (k) and controlling surface roughness during formation, a gate oxide can be formed with an EOT thinner than 2 nm. A thicker gate oxide that is more uniform, and easier to process can also be formed with the alternate material oxide of the present invention, the alternate material gate oxide possessing an EOT equivalent to the current limits of $SiO_2$ gate oxides. The smooth surface of the body region is preserved during processing, and a resulting transistor will have a smooth interface between the body region and the gate oxide with a surface roughness on the order of 0.6 nm.

Figure 5:
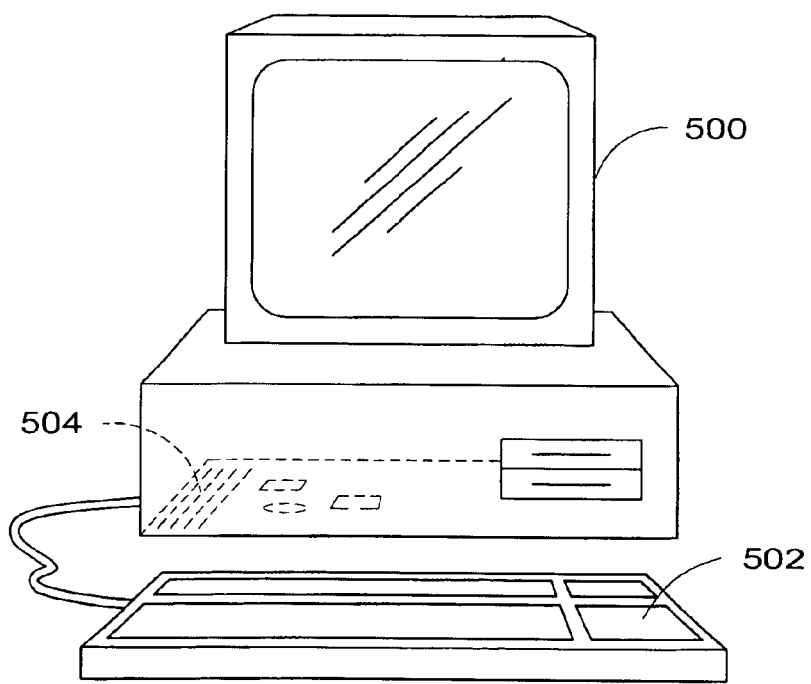
FIG. 5 shows a perspective view of a personal computer.
Figure 6:
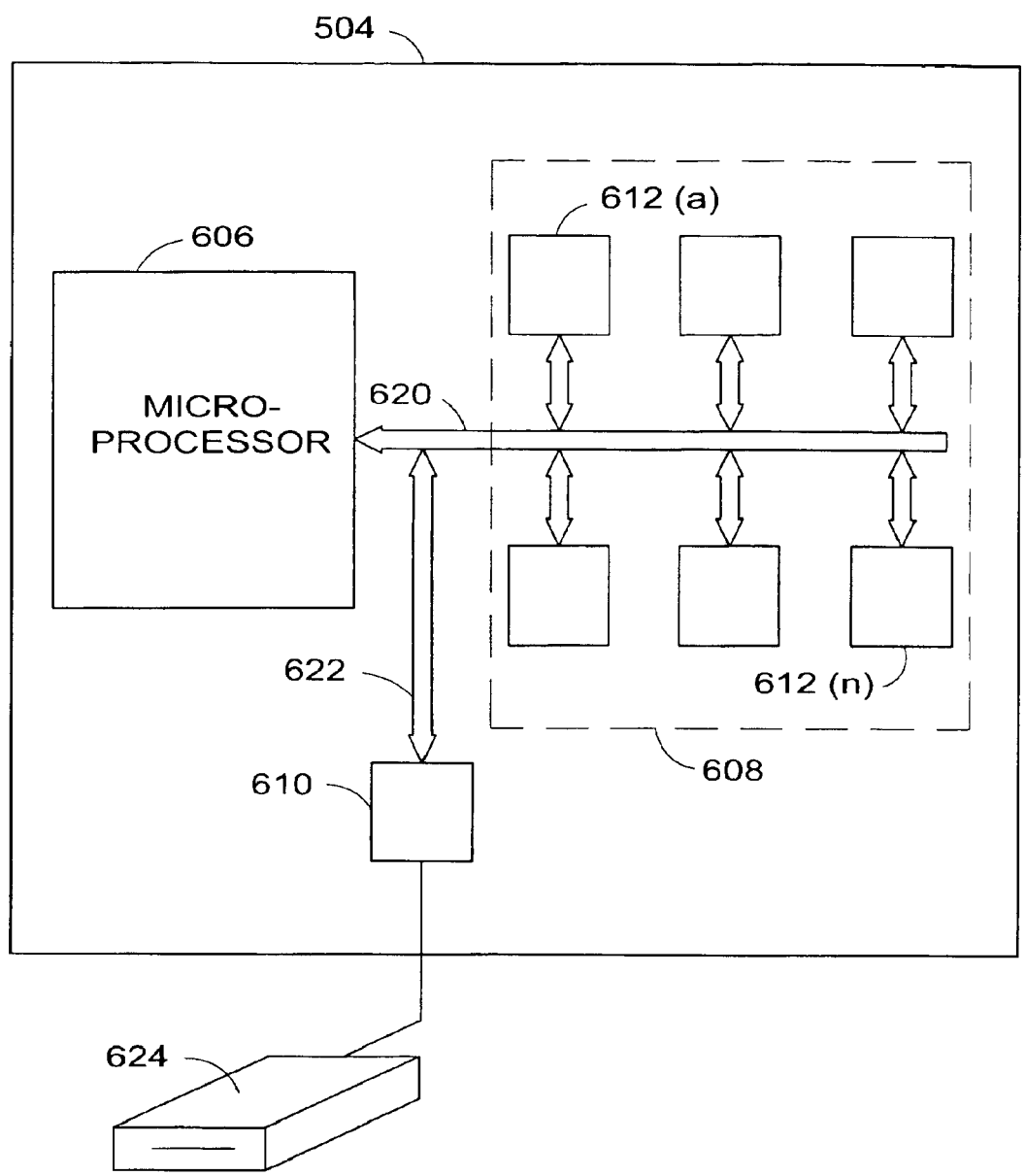
FIG. 6 shows a schematic view of a central processing unit.
Figure 7:
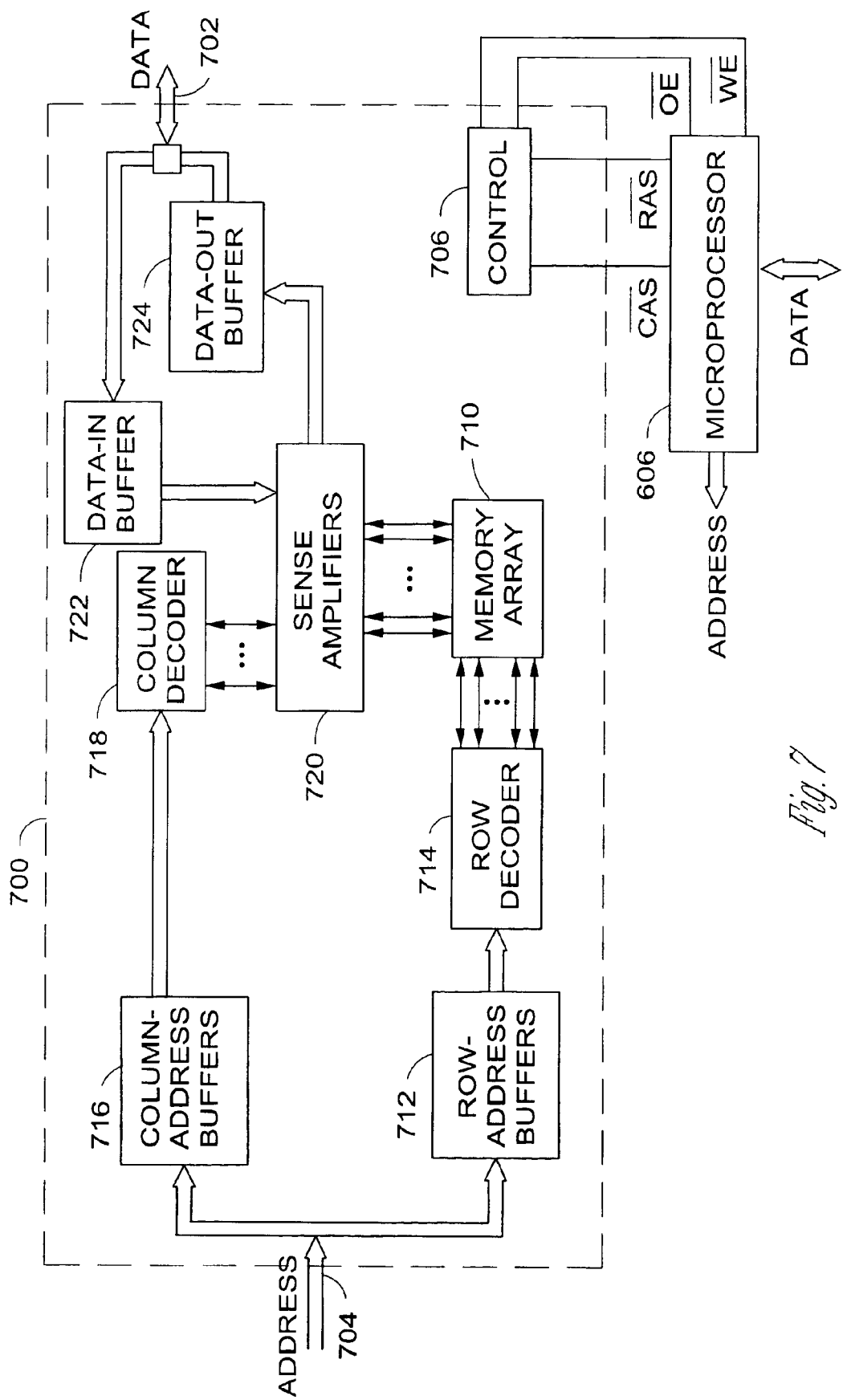
FIG. 7 shows a schematic view of a DRAM memory device.

Transistors created by the methods described above may be implemented into memory devices and information handling devices as shown in FIG. 5, FIG. 6, and FIG. 7 and as described below. While specific types of memory devices and computing devices are shown below, it will be recognized by one skilled in the art that several types of memory devices and information handling devices could utilize the invention.

A personal computer, as shown in FIGS. 5 and 6, includes a monitor 500, keyboard input 502 and a central processing unit 504. The processor unit typically includes microprocessor 606, memory bus circuit 608 having a plurality of memory slots 612(*a–n*), and other peripheral circuitry 610. Peripheral circuitry 610 permits various peripheral devices 624 to interface processor-memory bus 620 over input/output (I/O) bus 622. The personal computer shown in FIGS. 5 and 6 also includes at least one transistor having a gate oxide according to the teachings of the present invention.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612(*a–n*) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 612. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 608. A typical communication speed for a DRAM device using page mode is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 620. Other alternative types of devices include SDRAM, DDR SDRAM, SLDRAM and Direct RDRAM as well as others such as SRAM or Flash memories.

FIG. 7 is a block diagram of an illustrative DRAM device 700 compatible with memory slots 612(*a–n*). The description of DRAM 700 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 7 includes at least one transistor having a gate oxide according to the teachings of the present invention.

Control, address and data information provided over memory bus 620 is further represented by individual inputs to DRAM 700, as shown in FIG. 7. These individual representations are illustrated by data lines 702, address lines 704 and various discrete lines directed to control logic 706.

As is well known in the art, DRAM 700 includes memory array 710 which in turn comprises rows and columns of addressable memory cells. Each memory cell in a row is coupled to a common wordline. Additionally, each memory cell in a column is coupled to a common bitline. Each cell in memory array 710 includes a storage capacitor and an access transistor as is conventional in the art.

DRAM 700 interfaces with, for example, microprocessor 606 through address lines 704 and data lines 702. Alternatively, DRAM 700 may interface with a DRAM controller, a micro-controller, a chip set or other electronic system. Microprocessor 606 also provides a number of control signals to DRAM 700, including but not limited to, row and column address strobe signals RAS and CAS, write enable signal WE, an output enable signal OE and other conventional control signals.

Row address buffer 712 and row decoder 714 receive and decode row addresses from row address signals provided on address lines 704 by microprocessor 606. Each unique row address corresponds to a row of cells in memory array 710. Row decoder 714 includes a wordline driver, an address decoder tree, and circuitry which translates a given row address received from row address buffers 712 and selectively activates the appropriate wordline of memory array 710 via the wordline drivers.

Column address buffer 716 and column decoder 718 receive and decode column address signals provided on address lines 704. Column decoder 718 also determines when a column is defective and the address of a replacement column. Column decoder 718 is coupled to sense amplifiers 720. Sense amplifiers 720 are coupled to complementary pairs of bitlines of memory array 710.

Sense amplifiers 720 are coupled to data-in buffer 722 and data-out buffer 724. Data-in buffers 722 and data-out buffers 724 are coupled to data lines 702. During a write operation, data lines 702 provide data to data-in buffer 722. Sense amplifier 720 receives data from data-in buffer 722 and stores the data in memory array 710 as a charge on a capacitor of a cell at an address specified on address lines 704.

During a read operation, DRAM 700 transfers data to microprocessor 606 from memory array 710. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 720 detects and amplifies a difference in voltage between the complementary bitlines. The sense amplifier passes the amplified voltage to data-out buffer 724.

Control logic 706 is used to control the many available functions of DRAM 700. In addition, various control circuits and signals not detailed herein initiate and synchronize DRAM 700 operation as known to those skilled in the art. As stated above, the description of DRAM 700 has been simplified for purposes of illustrating the present invention and is not intended to be a complete description of all the features of a DRAM.

Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

CONCLUSION

Thus has been shown a gate oxide and method of fabricating a gate oxide that produce a more reliable and thinner equivalent oxide thickness. Gate oxides formed from yttrium, silicon and oxygen are thermodynamically stable such that the gate oxides formed will have minimal reactions with a silicon substrate or other structures during any later high temperature processing stages. In addition to the stable thermodynamic properties inherent in the gate oxide of the invention, the process shown is performed at lower temperatures than the prior art. This inhibits reactions with the silicon substrate or other structures, and inhibits unwanted migration of elements such as dopants.

Transistors and higher level ICs or devices have been shown utilizing the novel gate oxide and process of formation. The higher dielectric constant (k) oxide materials shown in one embodiment are formed with an EOT thinner than 2 nm, e.g. thinner than possible with conventional $SiO_2$ gate oxides. A thicker gate oxide that is more uniform, and easier to process has also been shown with at EOT equivalent to the current limits of $SiO_2$ gate oxides.

A novel process of forming a gate oxide has been shown where the surface smoothness of the body region is preserved during processing, and the resulting transistor has a smooth interface between the body region and the gate oxide with a surface roughness on the order of 0.6 nm. This solves the prior art problem of poor electrical properties such as high leakage current, created by unacceptable surface roughness.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the fill scope of equivalents to which such claims are entitled.

What is claimed is:

1. A transistor, comprising:
    a first and second source/drain region;
    a body region located between the first and second source/drain regions, wherein a surface portion of the body region has a surface roughness of approximately 0.6 nm or less;
    a yttrium-silicon-oxide layer coupled to the surface portion of the body region; and
    a gate coupled to the yttrium-silicon-oxide layer.

2. The transistor of claim 1, wherein the yttrium-silicon-oxide layer forms a direct interface with the body region.

3. The transistor of claim 1, wherein a purity of the yttrium-silicon-oxide layer is 99.9999% or greater.

4. The transistor of claim 1, wherein the yttrium-silicon-oxide layer is substantially amorphous.

5. The transistor of claim 1, wherein the yttrium-silicon-oxide layer exhibits a dielectric constant (k) of approximately 14.

6. A memory array, comprising:
    a number of access transistors, comprising:
        a first and second source/drain region;
        a body region located between the first and second source/drain regions, wherein a surface portion of the body region has a surface roughness of approximately 0.6 nm or less;
        a yttrium-silicon-oxide layer coupled to the surface portion of the body region; and
        a gate coupled to the yttrium-silicon-oxide layer;
    a number of wordlines coupled to a number of the gates of the number of access transistors;
    a number of sourcelines coupled to a number of the first source/drain regions of the number of access transistors; and
    a number of bitlines coupled to a number of the second source/drain regions of the number of access transistors.

7. The memory array of claim 6, wherein the yttrium-silicon-oxide layer forms a direct interface with the body region.

8. The memory array of claim 6, wherein a purity of the yttrium-silicon-oxide layer is 99.9999% or greater.

9. The memory array of claim 6, wherein the yttrium-silicon-oxide layer is substantially amorphous.

10. The memory array of claim 6, wherein the yttrium-silicon-oxide layer exhibits a dielectric constant (k) of approximately 14.

11. An information handling device, comprising:
    a processor;
    a memory array, comprising:
        a number of access transistors, comprising:
            a first and second source/drain region;
            a body region located between the first and second source/drain regions, wherein a surface portion of the body region has a surface roughness of approximately 0.6 nm or less;
            a yttrium-silicon-oxide layer coupled to the surface portion of the body region; and a gate coupled to the yttrium-silicon-oxide layer;
a number of wordlines coupled to a number of the gates of the number of access transistors;
a number of sourcelines coupled to a number of the first source/drain regions of the number of access transistors;
a number of bitlines coupled to a number of the second source/drain regions of the number of access transistors; and
a system bus coupling the processor to the memory device.

12. The information handling device of claim 11 wherein the yttrium-silicon-oxide layer forms a direct interface with the body region.

13. The information handling device of claim 11 wherein a purity of the yttrium-silicon-oxide layer is 99.9999% or greater.

14. The information handling device of claim 11 wherein the yttrium-silicon-oxide layer is substantially amorphous.

15. The information handling device of claim 11 wherein the yttrium-silicon-oxide layer exhibits a dielectric constant (k) of approximately 14.

16. A transistor formed by the process, comprising:
forming a body region coupled between a first source/drain region and a second source/drain region;
forming a gate oxide on the body region, including:
evaporation depositing a metal on the body region;
evaporation depositing a metal oxide on the body region; and
coupling a gate to the gate oxide layer.

17. The transistor of claim 16, wherein evaporation depositing the metal includes evaporation depositing yttrium.

18. The transistor of claim 16, wherein evaporation depositing the metal oxide includes evaporation depositing silicon dioxide ($SiO_2$).

19. The transistor of claim 16, wherein evaporation depositing the metal and evaporation depositing the metal oxide includes evaporation depositing by electron beam evaporation.

* * * * *